(12) United States Patent
DelMain et al.

(10) Patent No.: US 6,959,217 B2
(45) Date of Patent: Oct. 25, 2005

(54) MULTI-MODE CRYSTAL OSCILLATOR SYSTEM SELECTIVELY CONFIGURABLE TO MINIMIZE POWER CONSUMPTION OR NOISE GENERATION

(75) Inventors: Gregory Jay DelMain, Maple Grove, MN (US); John C. Gord, Venice, CA (US); Paul DeRocco, Pacific Palisades, CA (US)

(73) Assignee: Alfred E. Mann Foundation for Scientific Research, Santa Clarita, CA (US)

( * ) Notice: Subject to any disclaimer, the term of this patent is extended or adjusted under 35 U.S.C. 154(b) by 459 days.

(21) Appl. No.: 10/280,841

(22) Filed: Oct. 24, 2002

(65) Prior Publication Data

US 2004/0082982 A1 Apr. 29, 2004

(51) Int. Cl.[7] ................................................ A61N 1/00
(52) U.S. Cl. ...................... 607/60; 331/177 R; 323/911
(58) Field of Search .............................. 607/30–32, 59, 607/60; 331/116 R, 158, 175, 178, 177 R, 176; 323/304–318, 911

(56) References Cited

U.S. PATENT DOCUMENTS

| | | | | |
|---|---|---|---|---|
| 5,117,206 A | * | 5/1992 | Imamura | .................... 331/158 |
| 5,369,376 A | * | 11/1994 | Leblebicioglu | ................ 331/8 |
| 5,522,865 A | | 6/1996 | Schulman et al. | |
| 5,531,774 A | | 7/1996 | Schulman et al. | |
| 5,569,307 A | | 10/1996 | Schulman et al. | |
| 5,603,726 A | | 2/1997 | Schulman et al. | |
| 5,609,616 A | | 3/1997 | Schulman et al. | |
| 5,776,172 A | | 7/1998 | Schulman et al. | |
| 5,876,425 A | | 3/1999 | Gord et al. | |
| 5,938,691 A | | 8/1999 | Schulman et al. | |
| 6,164,284 A | | 12/2000 | Schulman et al. | |
| 6,185,452 B1 | | 2/2001 | Schulman et al. | |
| 6,563,390 B1 | * | 5/2003 | Kizziar | ................... 331/116 R |

OTHER PUBLICATIONS

High–Performance Crystal Oscillator Circuits: Theory and Application Eric A. Vittoz, Senior Member, IEEE, Mark G.R. Degrauwe, Member IEEE and Serge Bitz.

* cited by examiner

Primary Examiner—Scott M. Getzow
(74) Attorney, Agent, or Firm—Lee J. Mandell

(57) ABSTRACT

The present invention is directed to a multi-mode crystal oscillator system selectively configurable to minimize power consumption or noise generation. Such a system is particularly applicable to the communication system of an implantable device, e.g., the microstimulator/sensor device described in U.S. Pat. Nos. 6,164,284 and 6,185,452. In such devices, their small size limits the size of the battery contained within and thus makes it essential to minimize power consumption. Additionally, the small size and battery capacity result in a limited transmission power. Furthermore, the small size limits the antenna efficiency which makes it desirable to limit any noise generation to maximize the signal-to-noise level of the resulting receive signal. Accordingly, embodiments of the present invention alternatively supply power to the oscillator in either a first mode that minimizes power consumption or a second mode that minimizes noise generation.

39 Claims, 14 Drawing Sheets

MULTI-MODE CRYSTAL OSCILLATOR SYSTEM SELECTIVELY CONFIGURABLE TO MINIMIZE POWER CONSUMPTION OR NOISE GENERATION

FIELD OF THE INVENTION

The present invention is generally directed to crystal oscillators and in particular to the use of crystal oscillators in applications that require low power consumption, e.g., a battery-powered implantable medical device, and applications that require low noise, e.g., communication systems, and systems for selectively achieving both low power consumption and low noise generation.

BACKGROUND OF THE INVENTION

The present invention relates to systems and in particular communication systems which require the use of a crystal oscillator for controlling communication rates and/or modulation. In such systems, the crystal oscillator and/or a power supply for the crystal oscillator must have any noise generation minimized to thus maximize the signal-to-noise ratio for the transmitted signal and to maximize the capability to detect and demodulate a low signal-to-noise level receive signal. When such a communication system resides in a battery-powered system, it additionally becomes desirable to minimize power consumption whenever possible. When the battery-powered system is implantable and miniaturized, the need to minimize power consumption is further exacerbated. For example, commonly-owned U.S. Pat. No. 6,164,284 entitled "System of Implantable Devices For Monitoring and/or Affecting Body Parameters" and U.S. Pat. No. 6,185,452 entitled "Battery Powered Patient Implantable Device", incorporated herein by reference in their entirety, describe devices configured for implantation within a patient's body, i.e., beneath a patient's skin, for performing various functions including: (1) stimulation of body tissue and/or sensing of body parameters, and (2) communicating between implanted slave devices and a master device which may be external to a patient's body. Depending upon the ailment affecting the patient, it may be desirable to communicate with a number of different devices, e.g., from one to thousands, while maintaining an update rate, e.g., on the order of every millisecond to every second, sufficient to control and/or monitor the body parameter(s) at issue. Such implantable devices are preferably powered from rechargeable batteries. Depending upon the power requirements of these devices and the available capacity of their rechargeable batteries, the time between rechargings is potentially limited. Accordingly, power conservation techniques to extend the battery life of such devices are particularly desirable. The present invention is thus directed to a multi-mode crystal oscillator system selectively configurable to minimize power consumption or noise generation to thus achieve desired battery-life and communication performances suitable for such an implantable device.

SUMMARY OF THE INVENTION

The present invention is directed to a multi-mode crystal oscillator system selectively configurable to minimize power consumption or noise generation. Such a system is particularly applicable to the communication system of an implantable device, e.g., the microstimulator/sensor device described in U.S. Pat. Nos. 6,164,284; 6,185,452; 6,472,991; and the like. In such devices, their small size (an axial dimension of less than 60 mm and a lateral dimension of less than 6 mm) limits the size of the battery contained within and thus makes It essential to minimize power consumption. Additionally, the small size and battery capacity result in a limited amount of transmission power. Furthermore, the small size limits the antenna efficiency which makes it desirable to limit any noise generation to maximize the signal-to-noise level of the resulting receive signal. Accordingly, embodiments of the present invention alternatively supply power to a crystal oscillator in either a first mode that minimizes power consumption or a second mode that minimizes noise generation.

In accordance with a preferred embodiment, a crystal oscillator system configured for alternatively minimizing power consumption or noise generation, comprises: (1) a crystal oscillator; (2) a first power supply for powering the crystal oscillator in a first mode of operation, wherein the first power supply operates as a switching downconverter to minimize power consumption; (3) a second power supply for powering the crystal oscillator in a second mode of operation, wherein the second power supply operates as a series downconverter to minimize noise generation; and (4) mode switching circuitry for alternatively powering the crystal oscillator from the first or the second power supply according to desired system parameters.

In a further aspect of the present invention, the crystal oscillator system is of particular value when used in a communication system operating according to a communication protocol wherein the communication protocol is configured to have a majority of its time dedicated to intermessage delay portions between transmit and/or receive message portions (see, for example, U.S. Pat. No. 6,472,991 which is incorporated by reference herein in its entirety) and whereby the mode switching circuitry selects the second mode of operation during the transmit and/or receive message portions and the mode switching circuitry selects the first mode of operation during the intermessage delay portions.

In a still further aspect of preferred embodiments of the present invention, the crystal oscillator additionally includes circuitry for adjusting the operating frequency of the crystal oscillator. In a preferred implementation, this adjustment is accomplished by coupling a programmable capacitance to at least one node of the crystal of the crystal oscillator.

The novel features of the invention are set forth with particularity in the appended claims. The invention will be best understood from the following description when read in conjunction with the accompanying drawings.

DETAILED DESCRIPTION OF THE PREFERRED EMBODIMENTS

Figure 1:
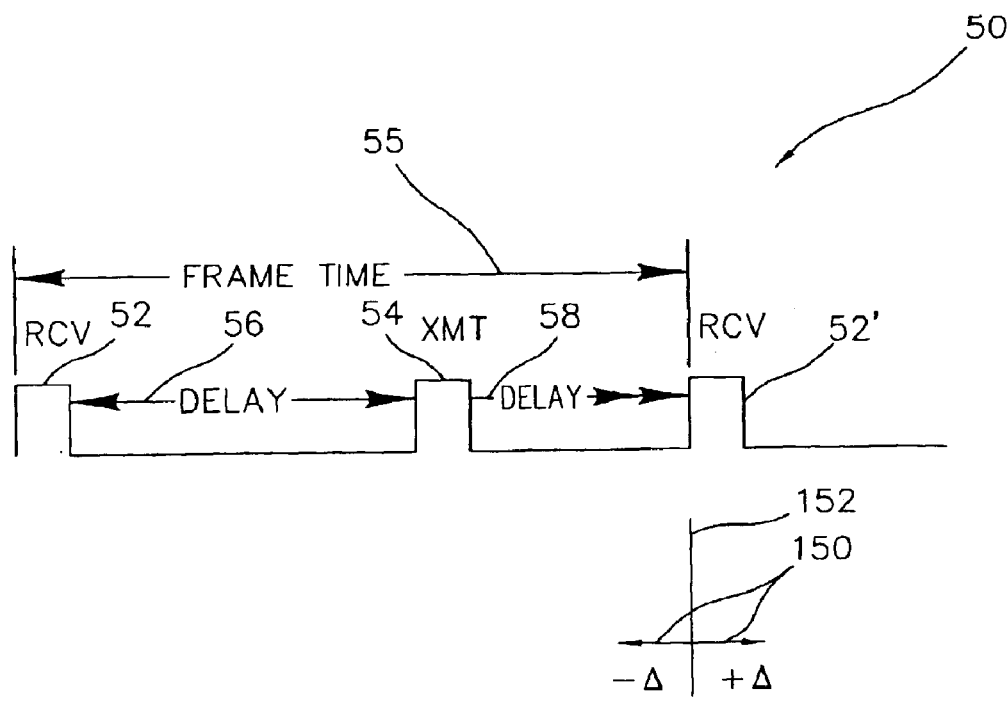
FIG. 1 is a simplified timing diagram of an exemplary communication protocol having temporally displaced receive and transmit portions. In a significant aspect of such a communication protocol, these relatively small receive and transmit portions are separated by relatively large intermessage delay portions.

The following description is of the best mode presently contemplated for carrying out the invention. This description is not to be taken in a limiting sense, but is made merely for the purpose of describing the general principles of the invention. The scope of the invention should be determined with reference to the claims.

The present invention is directed to a multi-mode crystal oscillator system selectively configurable to minimize power consumption or noise generation. Such a system is particularly applicable to the communication system of an implantable device, e.g., the microstimulator/sensor device described in U.S. Pat. Nos. 6,164,284; 6,185,452; 6,472, 991; and the like. In such devices, their small size (an axial dimension of less than 60 mm and a lateral dimension of less than 6 mm) limits the size of the battery contained within and thus makes it essential to minimize power consumption. Additionally, the small size and battery capacity result in a limited amount of transmission power. Furthermore, the small size limits the antenna efficiency which makes it desirable to limit any noise generation to maximize the signal-to-noise level of the resulting receive signal. Accordingly, embodiments of the present invention alternatively supply power to a crystal oscillator in either a first mode that minimizes power consumption or a second mode that minimizes noise generation.

In accordance with a preferred embodiment, a crystal oscillator system configured for alternatively minimizing power consumption or noise generation, comprises: (1) a crystal oscillator; (2) a first power supply for powering the crystal oscillator in a first mode of operation, wherein the first power supply operates as a switching downconverter to minimize power consumption; (3) a second power supply for powering the crystal oscillator in a second mode of operation, wherein the second power supply operates as a series downconverter to minimize noise generation; and (4) mode switching circuitry for alternatively powering the crystal oscillator from the first or the second power supply according to desired system parameters.

In a further aspect of the present invention, the crystal oscillator system is of particular use when used in a communication system operating according to a communication protocol wherein the communication protocol is configured to have a majority of its frame time dedicated to intermessage delay portions between transmit and/or receive message portions and whereby the mode switching circuitry selects the second mode of operation during the transmit and/or receive message portions and the mode switching circuitry selects the first mode of operation during the intermessage delay portions. An exemplary communication protocol suitable for use with the present invention is described in commonly-owned U.S. Pat. No. 6,472,991 (hereinafter referred to as the '991 patent), entitled "Multichannel Communication Protocol Configured To Extend The Battery Life Of An Implantable Device", the contents of which are incorporated herein by reference in their entirety.

Figure 2:
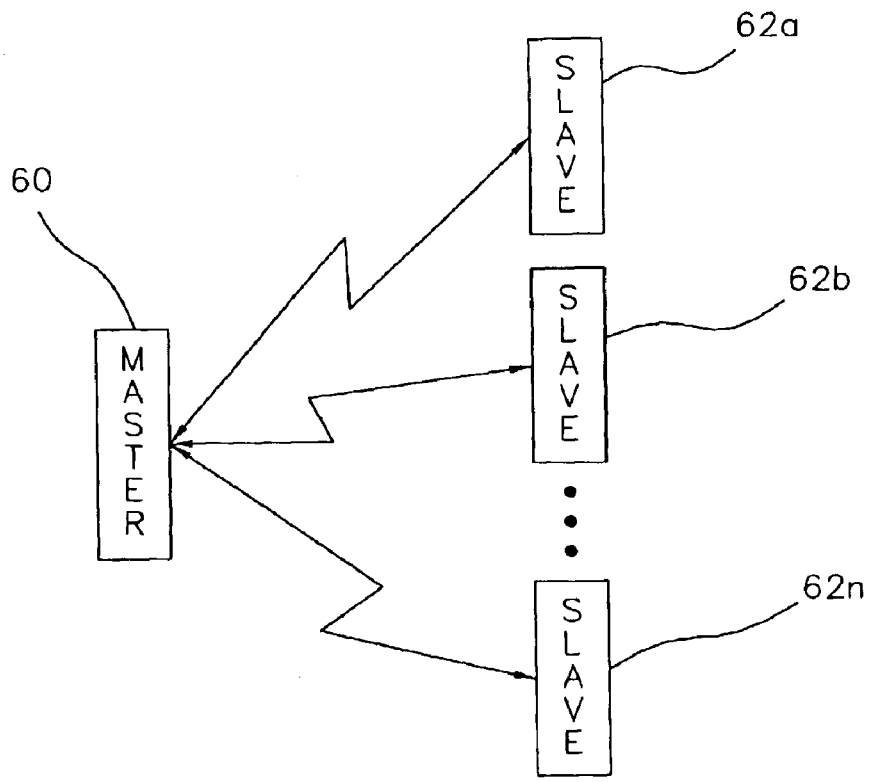
FIG. 2 comprises a simplified block diagram of a master controller which periodically communicates with a plurality of slaves across a bidirectional, half-duplex communication link.

FIG. 1 is a simplified timing diagram of such an exemplary bidirectional, half-duplex communication protocol 50 having temporally displaced receive 52 and transmit 54 time periods within each frame time 55. In a significant aspect of such a communication protocol, these relatively small receive 52 and transmit 54 time periods are separated by a relatively large intermessage delay time periods 56, 58. In the exemplary protocol (a simplified example of that described in the '991 patent), a master controller 60 (see FIG. 2) periodically sends command/status requests to one or more slaves 62a–62n (see FIG. 2) during receive period 52. Each slave 62 then transmits status/data information back to the master controller 60 during a transmit period 54 where the temporal position of transmit period 54 is defined at least in part by a unique identifier, e.g., a device ID, for each slave 62. What is significant about this protocol structure 50 is that the timing capability of each slave 62 must be sufficiently precise so that the transmit period 54 for each slave 62 will not overlap or otherwise interfere with another slave 62. Providing that this precision is achieved, the '991 patent teaches that power savings can be achieved by turning off portions of the communication circuitry when they are not needed, e.g., during the intermessage delay portions 56, 58. These power savings can be quite significant due to the relatively small percentage of the frame time 55 that receive and transmit circuitry portions are needed (see time periods 52, 54) versus the intermessage delay portions (see time periods 56, 58).

However, to fully achieve the potential benefits of this communication protocol 50, power consumption for any remaining circuitry must be minimized as well. To achieve sufficient timing precision, a crystal oscillator is needed and since timing related to the crystal oscillator is used for determining the position of each time period, it must be operational throughout each cycle of the communication protocol 50. Accordingly, it is preferred that the selected crystal oscillator circuit consume relatively small amounts of power. Furthermore, it is preferred that the selected crystal oscillator circuit operate at a low voltage, e.g., preferably below 2 volts (0.9 volts in a preferred implementation). Such a crystal oscillator is described by Eric A. Vittoz, Marc G. R. Degrauwe and Serge Bitz in their article entitled "High-Performance Crystal Oscillator Circuits: Theory and Application" (see IEEE Journal of Solid State Circuits, Vol. 23, No. 3, June 1988) which is incorporated herein by reference in its entirety. Such a crystal oscillator (referred to herein as a Vittoz-type oscillator) reduces power by starving out the current needs of its FET circuitry to just above its critical needs during oscillation while providing an initial current startup burst to begin its oscillation.

Embodiments of the present invention further reduce the power consumption of the selected oscillator, e.g., a Vittoz-type oscillator, by using a switching mode type of power supply to downconvert a power source to the operating voltage for the oscillator. Additionally, since such a switching mode power supply typically generates noise that could adversely effect communication capabilities, embodiments of the present invention switch to using a series downconverter mode power supply during the transmit 54 and/or receive 52 time periods.

Figure 3:
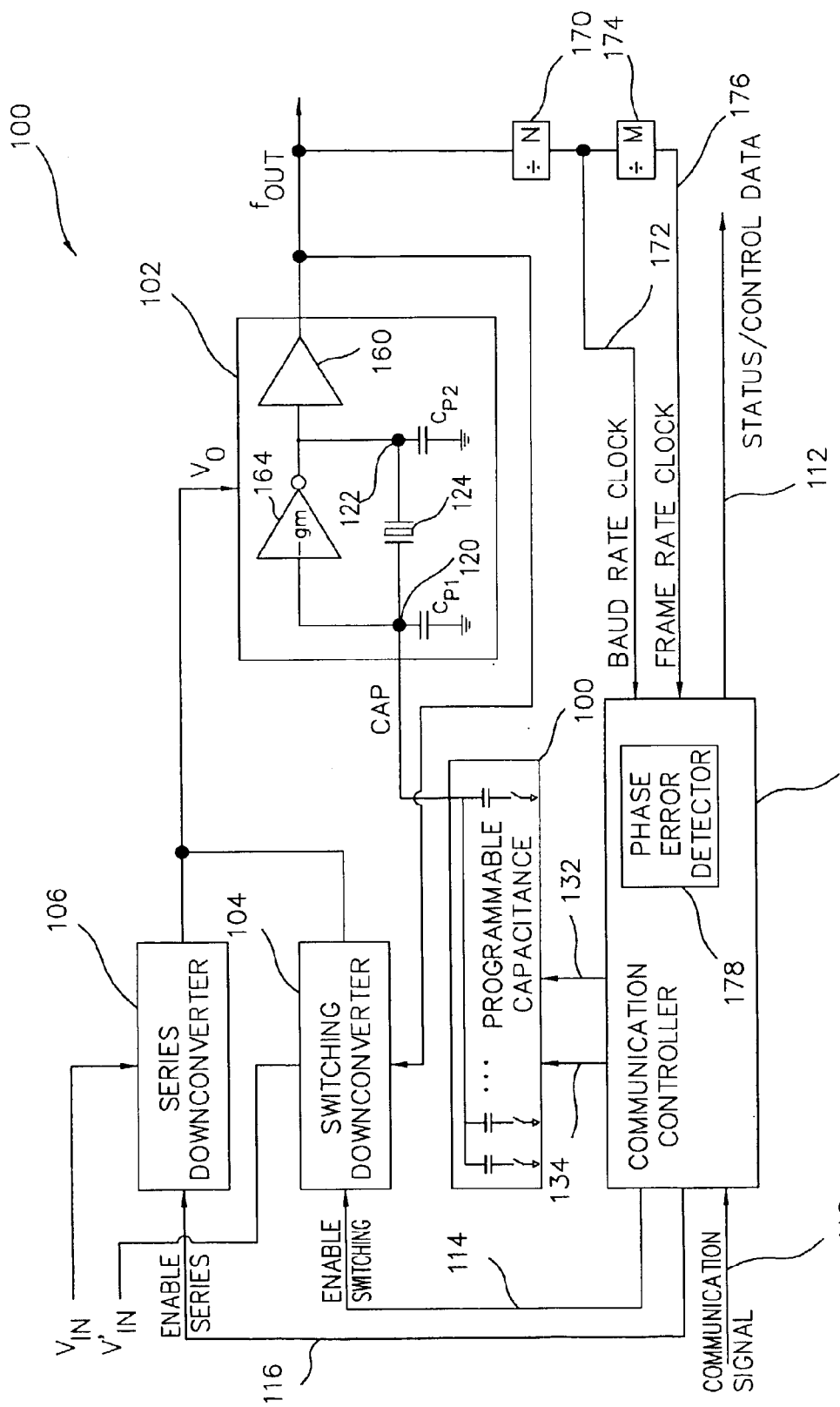
FIG. 3 comprises a block diagram of an oscillator system of the present invention wherein an oscillator, preferably low power, is powered from at least two power supplies, a first one that minimizes power consumption that is used during the intermessage delay portions and a second one that minimizes noise generation that is used during the transmit and/or receive message portions.

FIG. 3 comprises a block diagram of an oscillator system 100 of the present invention wherein an oscillator 102, preferably a low power oscillator such as a Vittoz-type oscillator, is powered from at least two power supplies, a first one 104 that minimizes power consumption that is used during the intermessage delay portions 56, 58 and a second one 106 that minimizes noise generation that is used during the transmit 54 and/or receive 52 message portions. Oscillator 102 preferably runs off of a low voltage $V_o$, e.g., 0.9 volts in a currently preferred implementation, and a low current, typically less than 50 $\mu a$ and preferably less than 5 $\mu a$ depending upon the programmed amplitude of oscillation to generate a frequency output $f_{out}$, e.g., 25 MHz, suitable for division to obtain timing and modulation frequencies. Series downconverter mode power supply 106 operates in a conventional manner, e.g., in a constant voltage or current mode, to reduce the voltage $V_{IN}$, e.g., 1.8 volts in a currently preferred implementation, to $V_o$ while switching downconverter mode power supply 104 operates on voltage $V'_{IN}$, e.g., 2.7 volts in a currently preferred implementation, to reduce it to $V_o$. (While a different $V_{IN}$ and $V'_{IN}$ have been described, implementations in which a common voltage supplies both $V_{IN}$ and $V'_{IN}$ are also considered to be within the scope of the present invention.) Communication controller 108 operates upon communication signal 110 to retrieve status requests and control data and generates responsive signals 112. When the communication controller 110 determines that it is processing the intermessage delay portions 56, 58, it activates the enable switching control line 114 to turn on the switching downconverter 104. Conversely, the enable series control line 116 is activated to turn on the series downconverter 106 during the receive 52 and/or transmit 54 time periods.

Figure 4A:
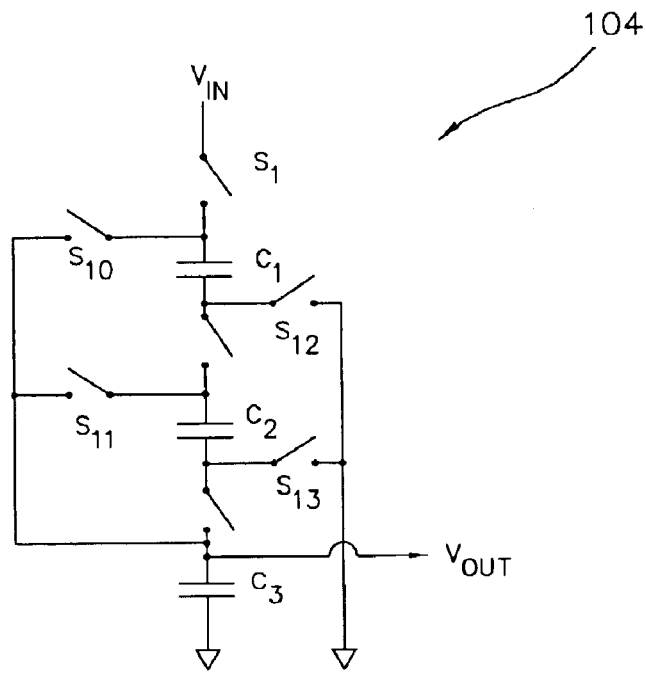
FIG. 4A shows a simplified example of a switching downconverter, suitable for use with the system of FIG. 3, which comprises a plurality of capacitors and switches for reconfiguring the charge and discharge paths to and from the capacitors to thus form a power efficient downconverter. While such a switching downconverter is relatively power efficient as compared to a series downconverter, such a switching downconverter does generate more noise.
Figures 4B, 4C:
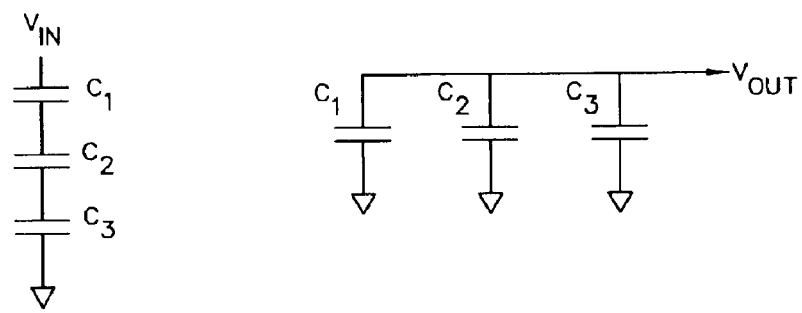
FIG. 4B shows the configuration of the capacitors of FIG. 4A when the capacitors are being charged.
FIG. 4C shows the configuration of the capacitors of FIG. 4A when the capacitors are being discharged.
Figure 4D:
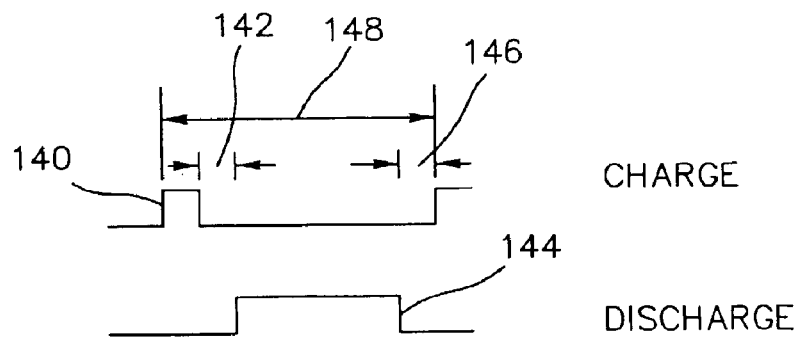
FIG. 4D is a timing diagram of the cycling of the switches within the switching downconverter of FIG. 4A.
Figure 5:
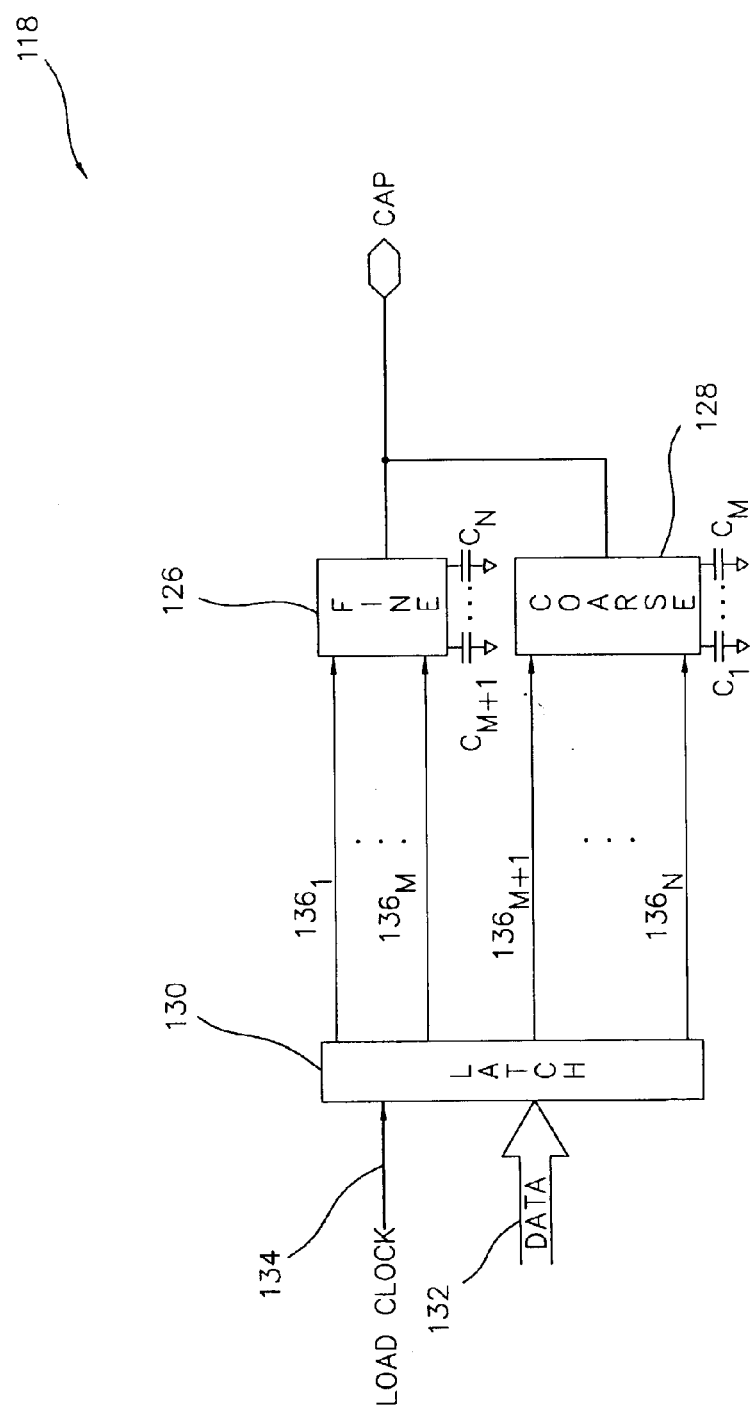
FIG. 5 shows a simplified block diagram of a programmable capacitance, separated into a coarse and fine range of adjustment, for adjusting the operating frequency of the crystal oscillator by loading down at least one of the connection nodes of the crystal.

FIG. 4A shows a simplified example of switching downconverter 104, suitable for use with the system 100 of FIG. 3, which comprises a plurality of capacitors ($C_1$–$C_3$) and switches ($S_1$–$S_3$, $S_{10}$–$S_{13}$) for reconfiguring the charge and discharge paths to and from the capacitors to thus form a power efficient downconverter. While such a downconverter 104 is relatively power efficient as compared to the series downconverter 106, switching downconverter 104 does generate more noise (which is not desirable during receive 52 and/or transmit 54 time periods). By periodically enabling and/or disabling switches within the switching downconverter 104, input voltage $V_{IN}$ is downconverted to an output voltage $V_{OUT}$ (which is used as $V_o$ at the oscillator 102). The switching downconverter 104 will typically decrease the current drain by a factor of 3 minus the switching efficiency, e.g., a factor of approximately 2.5. The average current drain is further reduced relative to the ratio of the time that power is supplied by the switching downconverter 106 (adjusted by its efficiency) to the time that power is supplied by the series downconverter 106. Accordingly, an average current drain will be:

((time periods 56+58)/((time periods 52+54+56+58)*2.5)+(time periods 52+54)/(time periods 52+54+56+58))*peak current drain Accordingly during a first time period (see FIG. 4D), a charging time period 140, capacitors $C_1$, $C_2$, $C_3$ are charged in series such that each one is charged to a voltage of one third of $V_{IN}$. During this time period, $S_1$, $S_2$, and $S_3$ are enabled while all of the other switches are disabled. Accordingly, FIG. 4B shows the configuration of the capacitors of FIG. 4A when the capacitors are being charged. Preferably, all switches are disabled during a first inter-switching delay period 142 and then during a second time period, a discharging time period 144, switches $S_1$–$S_3$ are disabled and the remaining switches $S_{10}$–$S_{13}$ are enabled in order to supply a voltage of one third of $V_{IN}$ to $V_{OUT}$. Accordingly, FIG. 4C shows the configuration of the capacitors of FIG. 4A when the capacitors are being discharged. Preferably, all switches are again disabled during a second inter-switching delay period 146 and then the voltage downconversion cycle 148 recommences. The timing of the voltage downconversion cycle 148 is controlled according to a frequency division (not shown) of the crystal oscillator frequency $f_{out}$. However, during system startup there is no oscillator frequency available. Accordingly, the oscillator system 100 of the present invention uses the series downconverter 106 to power the oscillator 102 during startup.

Figure 7:
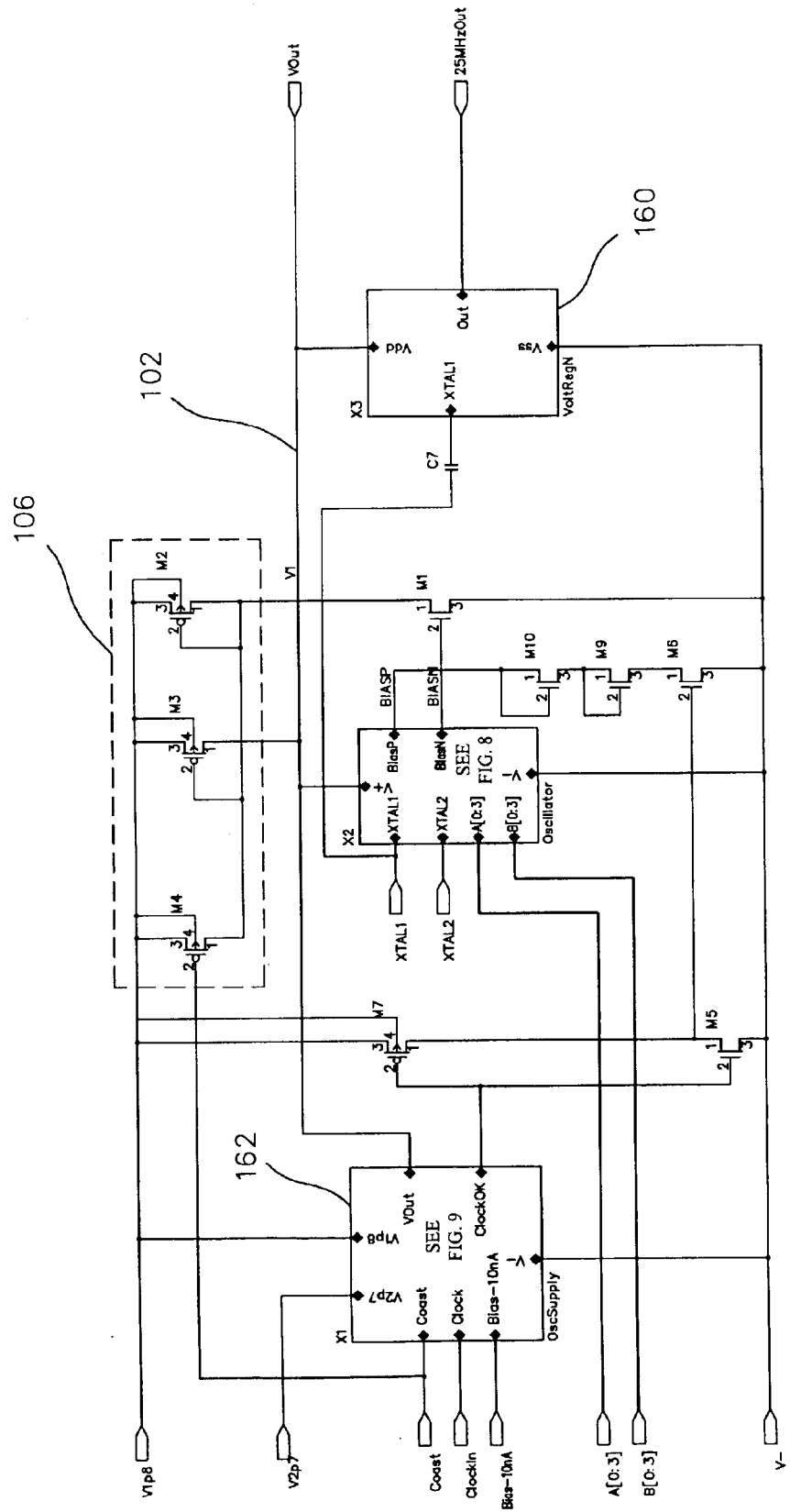
FIGS. 7–10 are detailed schematics of a presently preferred implementation of the crystal oscillator system (see FIG. 3) of the present invention (minus the programmable capacitance of FIGS. 11A, 11B, 12–14).
Figure 8:
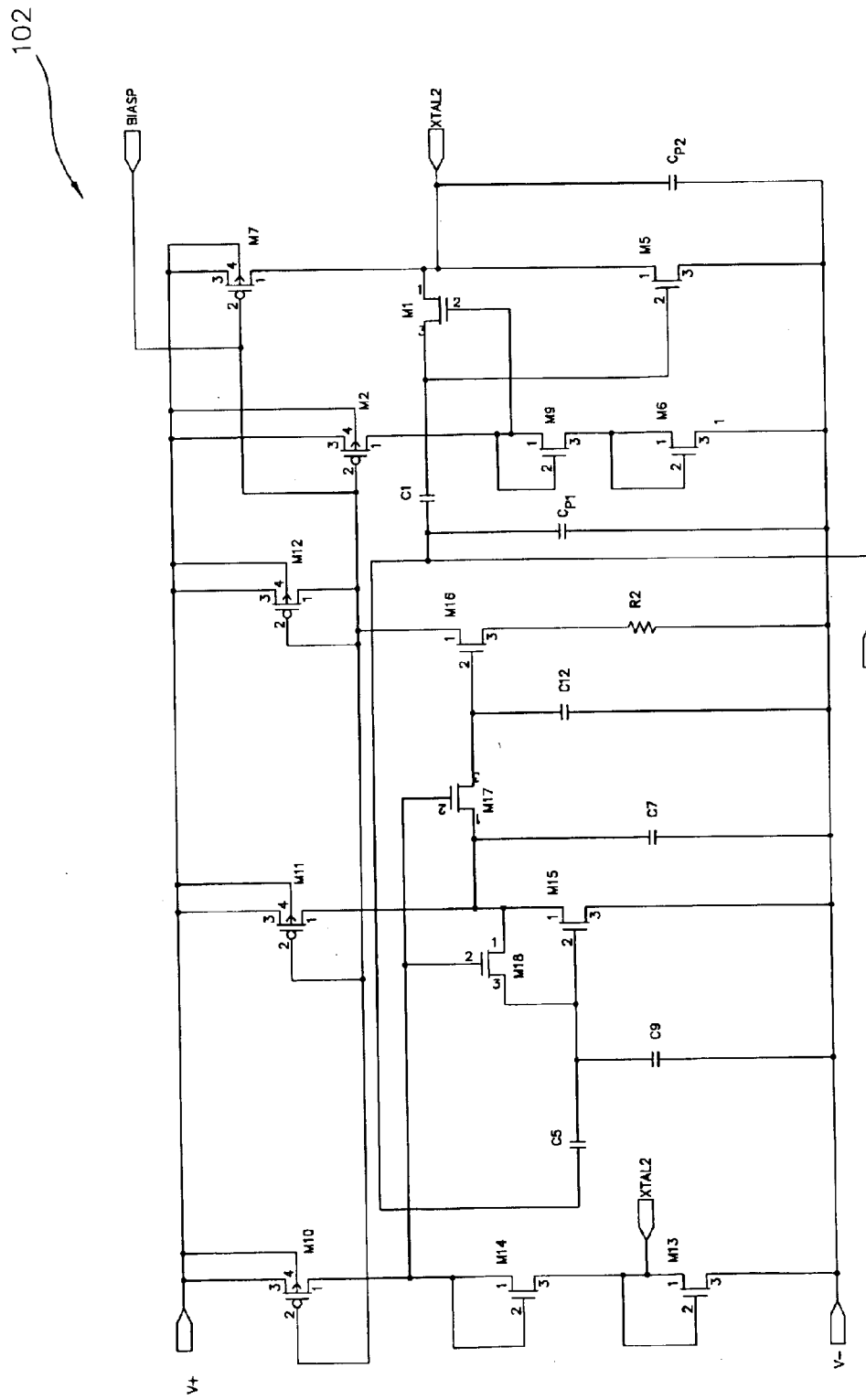
Figure 9:
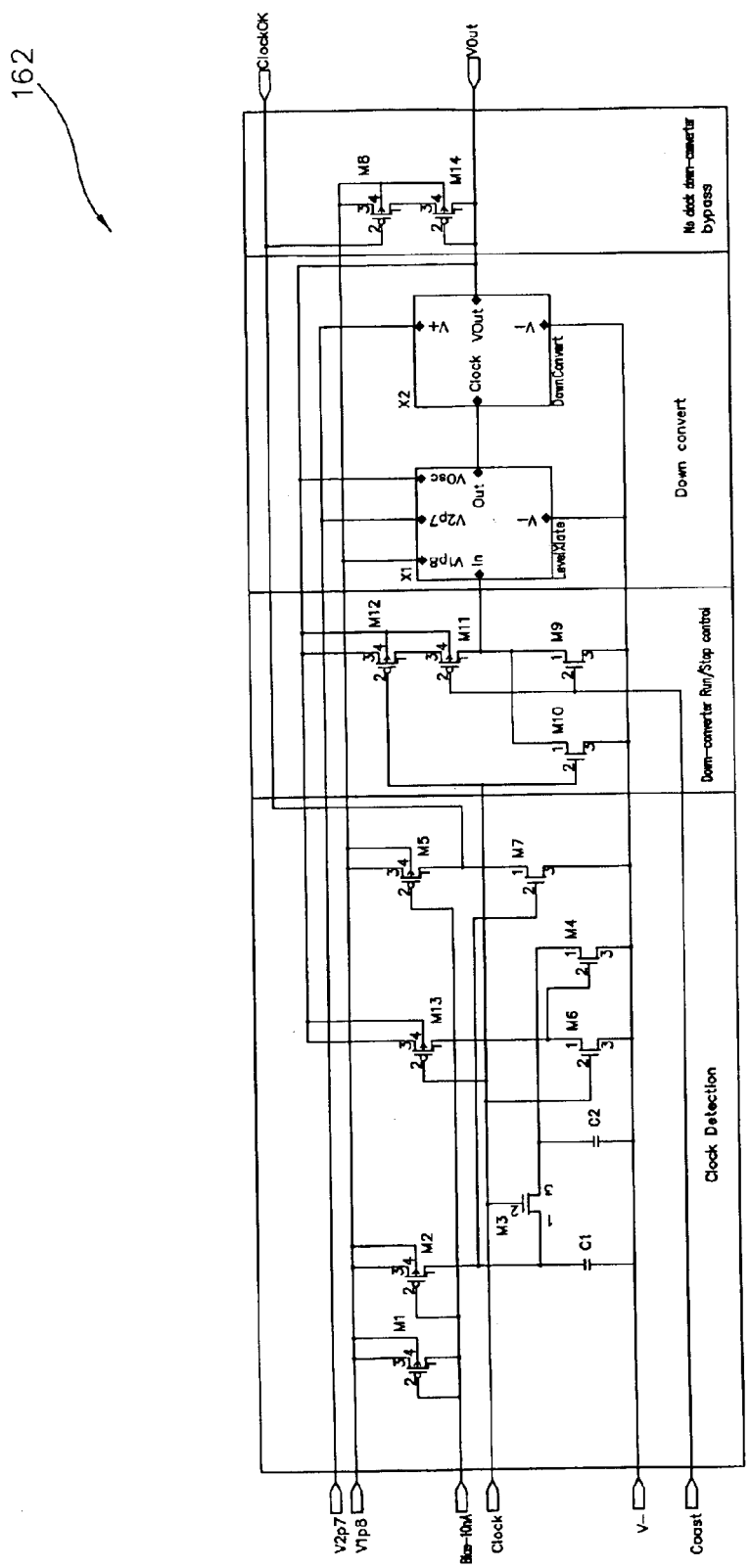
Figure 10:
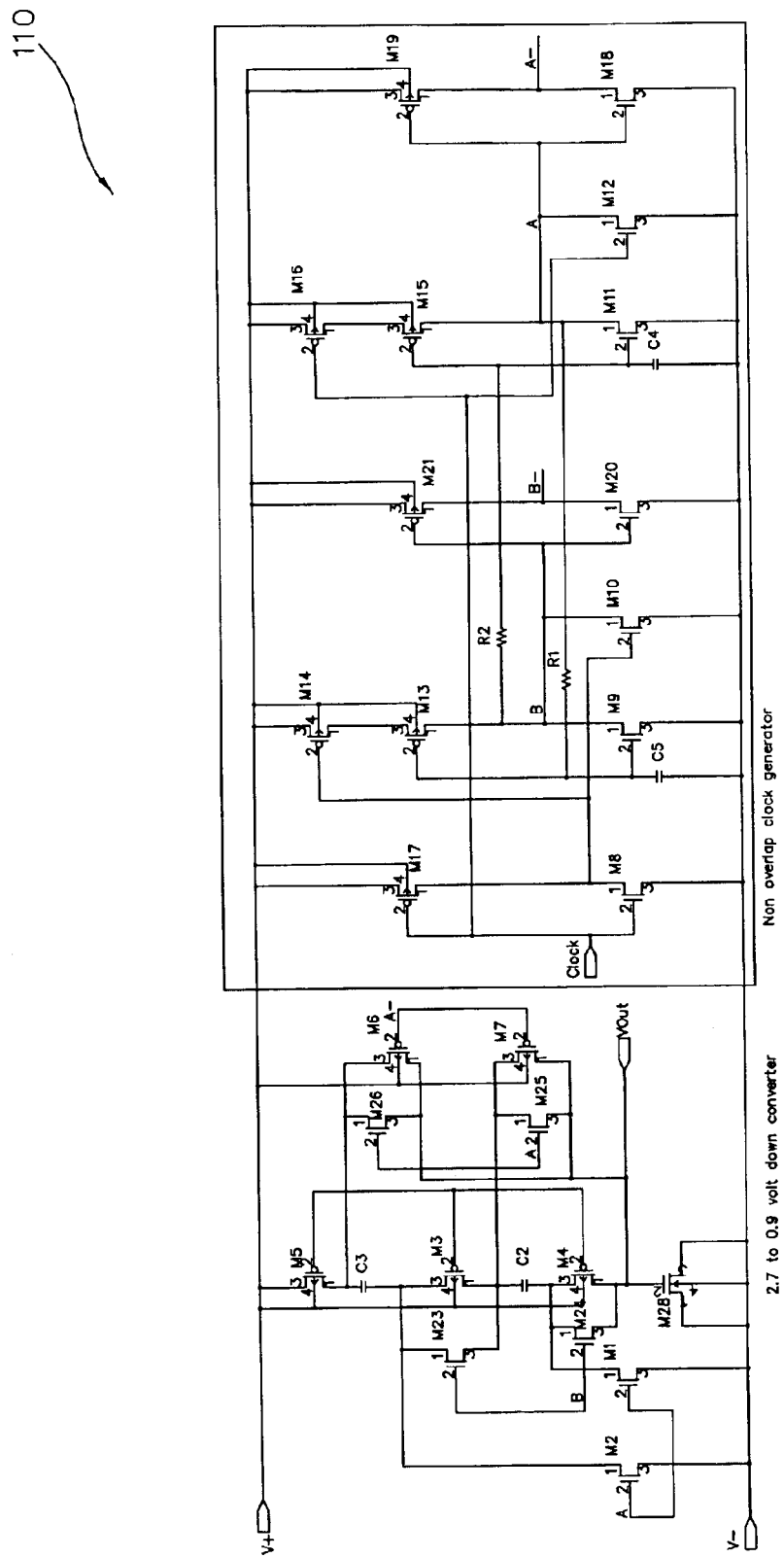

FIGS. 7–10 are detailed schematics of a presently preferred implementation of the crystal oscillator system 100 (see FIG. 3) of the present invention (minus the programmable capacitance of FIGS. 11A, 11B, 12–14). In particular, FIG. 7 is the overall block diagram of the crystal oscillator system 100 including the crystal oscillator 102 and linear downconverter, i.e., series downconverter 106. Additionally, an output buffer 160 and power sequencing control logic 162 (this function has previously been considered to be a portion of communication controller 108) are additionally shown but the switching downconverter portion 104 of the system is shown in detail in FIG. 10. FIG. 8 shows a detailed schematic of the crystal oscillator 102 and FIG. 9 shows a detailed schematic of the sequencing control logic 162.

In a still further aspect of preferred embodiments of the present invention, the crystal oscillator system 100 additionally includes circuitry for adjusting the frequency of the crystal oscillator 102. The crystal oscillator is essentially comprised of an inverting transconductance amplifier 164 (see FIG. 3) having its current source output connected to a second node 122 of the crystal 124 and a first node 120 of the crystal 124 connected to the input of the inverting transconductance amplifier 164. Additionally, capacitors $C_{p1}$, $C_{p2}$ are respectively coupled to connection nodes 120, 122. The crystal 124 has a series resonance frequency which is preferably selected to be slightly below a target frequency (approximately 25 MHz in a preferred implementation). However, in the preferred embodiment, oscillator 102 is configured in a mode to operate in a parallel resonance mode in which the crystal 124 oscillates at a frequency above (approximately 0.1% above) the series resonance frequency. The operating frequency of an oscillator operated in a parallel resonance mode is determined by the amount of capacitive loading on the crystal. The highest frequency is initially determined by the parasitic capacitive ($C_{p1}$, $C_{p2}$)

loading on each of the connection nodes 120, 122 of the crystal 124. As the capacitance increases (within limits) on either one of the operating nodes (120 or 122), the operating frequency decreases (nonlinearly) toward the series resonance frequency. Accordingly, the operating frequency of the oscillator 102 may be adjusted by coupling a programmable capacitance to either one of the crystal 124 connection nodes, i.e., node 120 or node 122. The programmable capacitance is formed from a plurality of capacitors $C_1$–$C_N$ which are selectively combined with a plurality of switches 126, 128, preferably semiconductor switches such as FETs. The selection of which portions of switches 126, 128 are enabled is preferably determined by the output of a latch 130 under control of the communication controller 108 via a data bus 132 and a load clock 134. While many schemes (e.g., binary weighting) are possible for the selection of the capacitors that form the programmable capacitance 118, the preferred implementation utilizes a scheme where at least some of the capacitors are cumulatively enabled, i.e., first $C_1$, then $C_1+C_2$, then $C_1+C_2+C_3$, etc. Such a scheme, referred to herein as thermometer encoding due to the correspondence of the sequencing of at least a portion of its enable lines $136_1$–$136_N$ to a conventional thermometer, ensures monoticity. This monoticity simplifies the closed loop control (described later) for controlling the frequency of the crystal oscillator 102. Additionally, to ensure a sufficient range of adjustment, many schemes, e.g., an exponential range of adjustment, are also possible. In the presently-preferred implementation, a coarse adjustment 128 (which uses the aforementioned thermometer decoder) is coupled with a fine adjustment 126 to achieve a sufficient range and precision of adjustment. Capacitors $C_1$–$C_M$ and $C_{M+1}$–$C_N$ are selectively combined accordingly using their associated switches 128, 126 to achieve the coarse and fine adjustments.

Figure 11A:
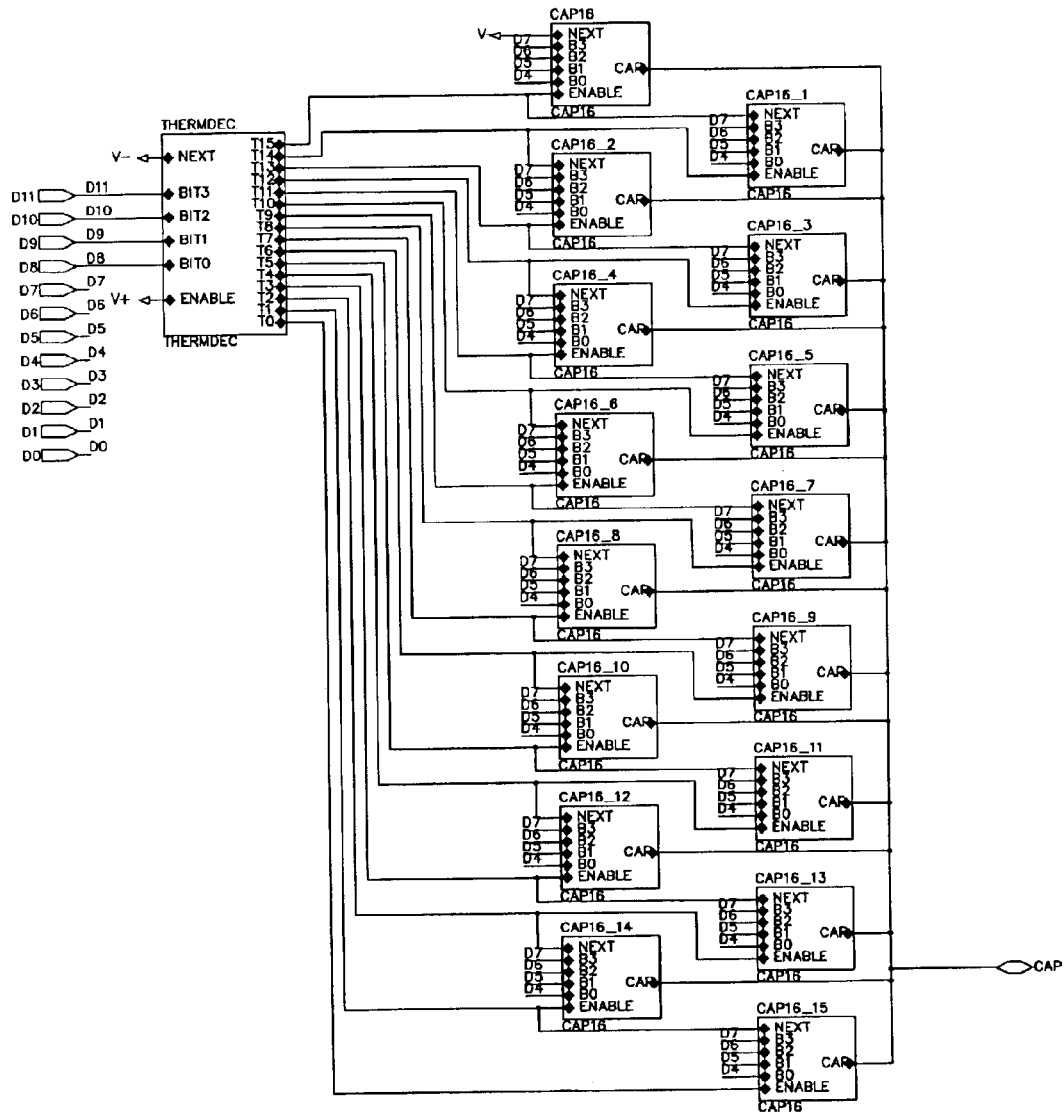
FIGS. 11A, 11B, 12–14 are detailed schematics of a presently preferred implementation of the programmable capacitance of FIG. 3.
Figure 11B:
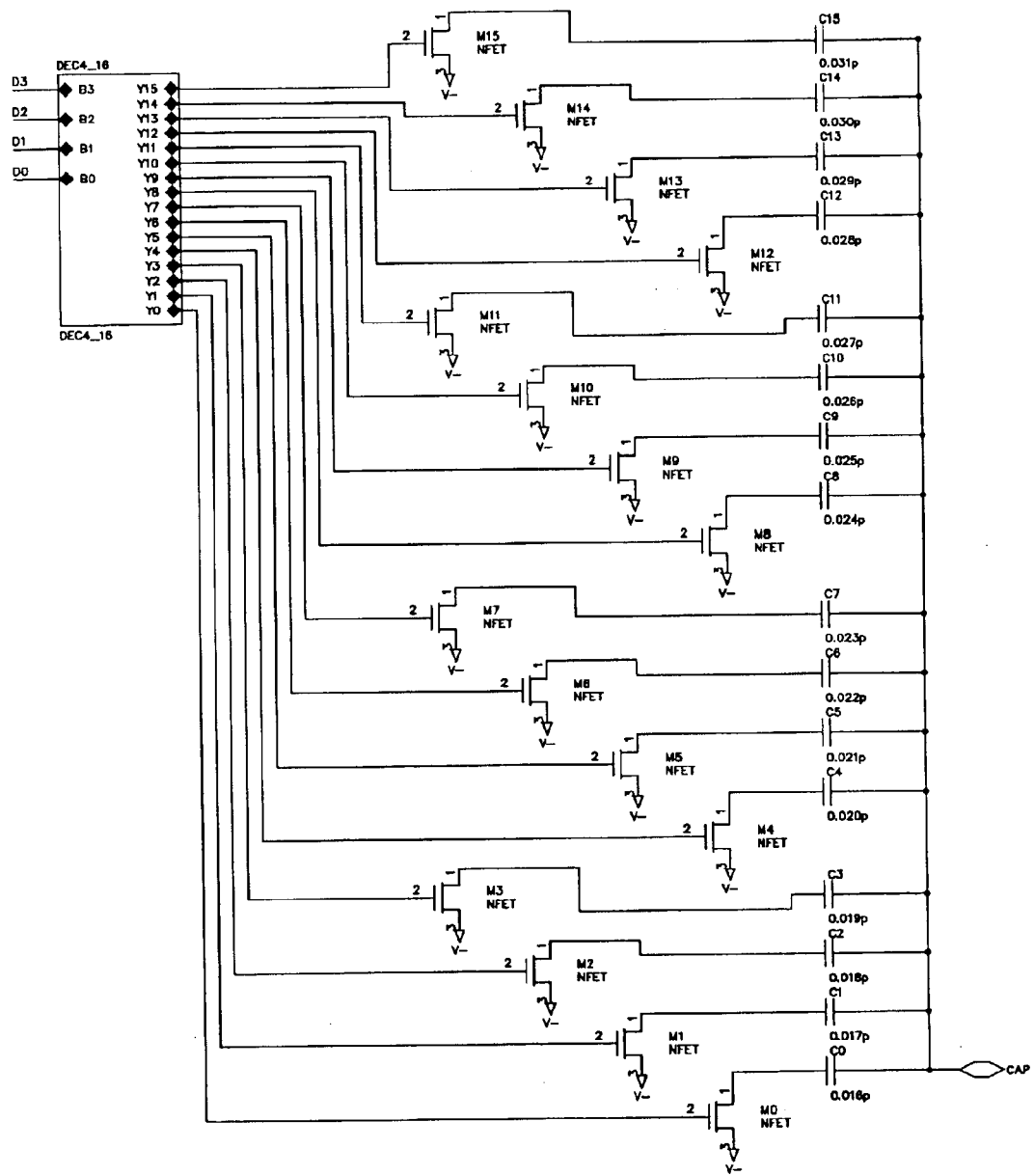
Figure 12:
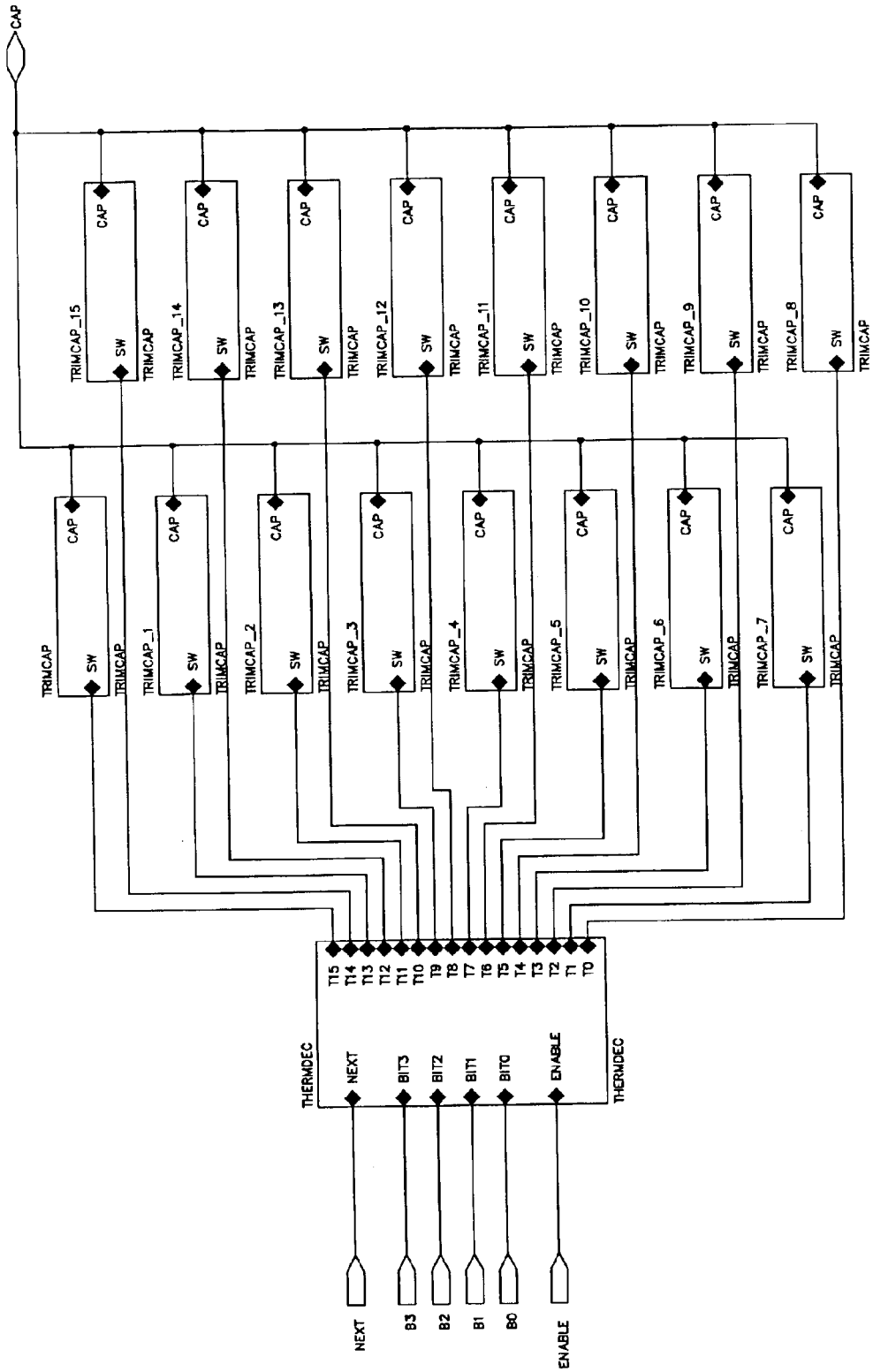
Figure 13:
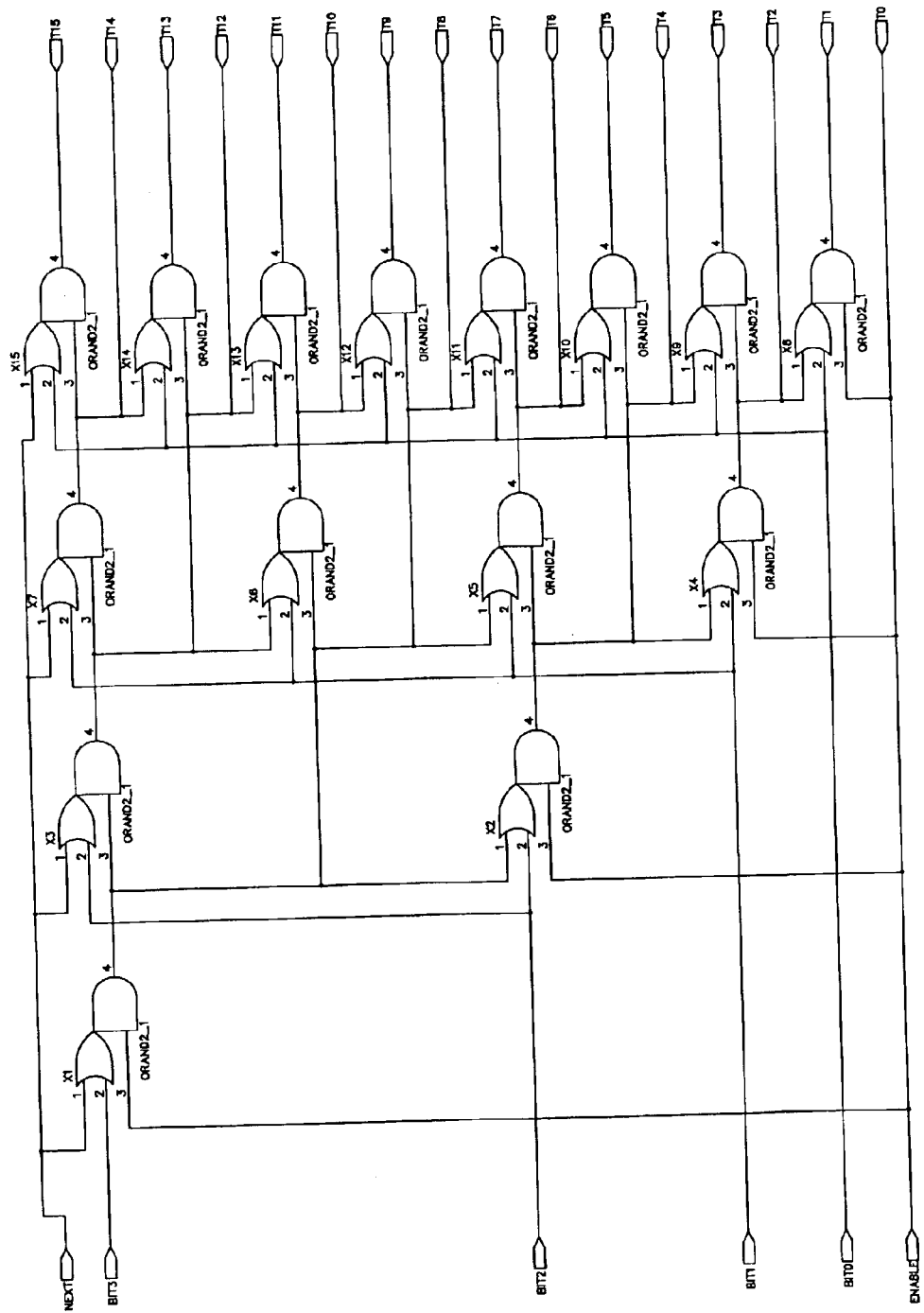
Figure 14:
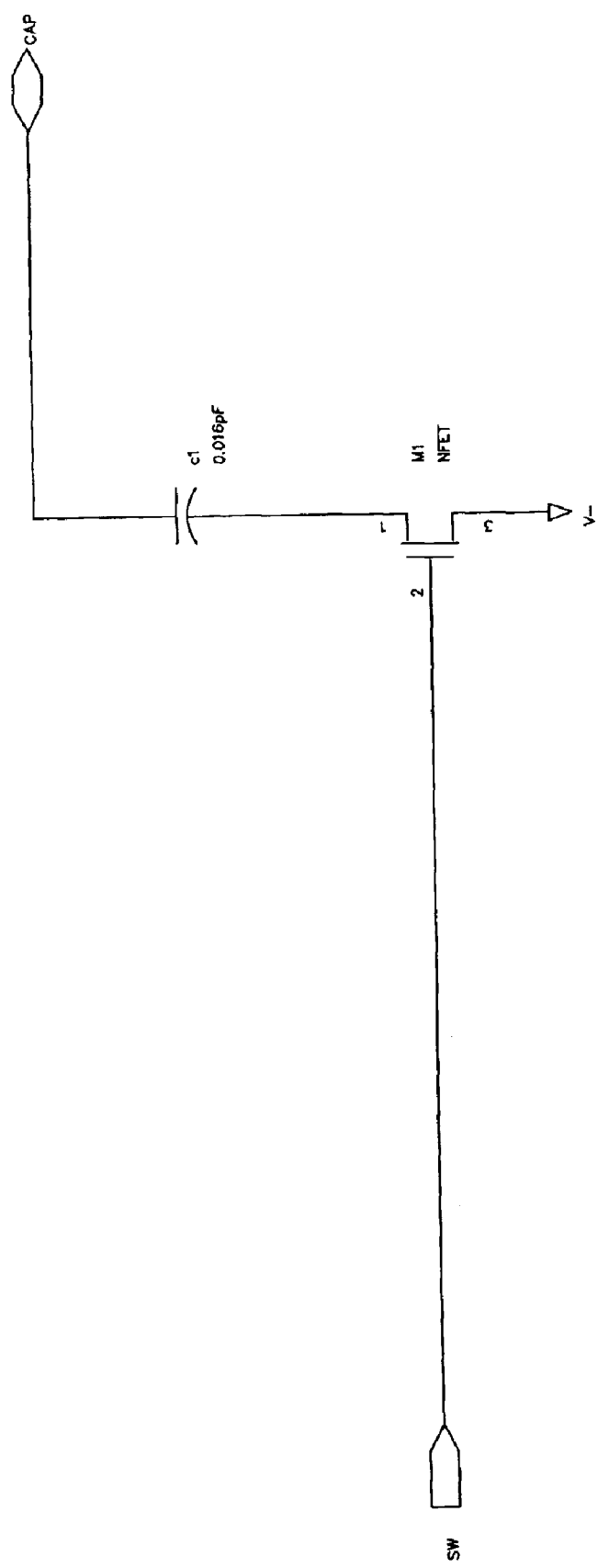

FIGS. 11A, 11B, 12–14 are detailed schematics of a presently-preferred implementation of the programmable capacitance 118 of FIG. 3. In this implementation, a 12-bit value is used to select the capacitance value with the lower 4 bits, i.e., D0–D3, selecting one of sixteen capacitors ranging from 0.016 pf (picofarads) to 0.031 pf (forming the fine adjustment 126) and the upper 8 bits, i.e., D4–D11, selecting (using a plurality of thermometer decoders) from 1 to 256 capacitors (for forming the coarse adjustment 128), each of which having a value of 0.016 pf. Accordingly, a range of 0.032 pf (i.e., 0.016 pf fine+0.016 pf coarse) to 4.127 pf (i.e., 0.031 pf fine to 256*0.016 pf coarse). In the detailed schematics, FIG. 11A shows a plurality of thermometer decoders and associated trim capacitors which comprise an implementation of the coarse switches 128, FIG. 11B shows an implementation of the fine switches 126 and associated capacitors, FIG. 12 shows a simplified schematic of a representative thermometer decoder, FIG. 13 shows a detailed schematic of a representative thermometer decoder, and FIG. 14 shows a detailed schematic of a representative trim capacitor and switch as used in FIG. 12.

Referring again to FIG. 1, we again note the placement of the transmit portion 54 following the receive portion 52 is determined at least in part by a unique device ID. The relative placement of the transmit portion 54 is particularly significant in the exemplary protocol 50, i.e., intermessage delay 56 must be sufficiently precise to ensure a lack of interference between transmit portions 54 of the other slaves 62. In the '991 patent, the use of a phase locked loop in the slave device 62 is described which adjusts the phase of its clock to data received from the master device 60 in receive time period 52. However, it is still preferred to ensure the accuracy of the crystal oscillator 124 by adjusting its frequency as well (when necessary). In FIG. 3, a divide-by-N 170 is shown which divides $f_{out}$ to obtain a baud rate clock 172. The baud rate clock 172 is further divided by a divide-by-M 174 (where M is the product of the bauds per word and the number of words per frame) to obtain a frame rate clock 176. (the location of divide-bys 170 and 174 are only exemplary and they may be located elsewhere, e.g., in portions of the oscillator 102, communication controller 108, etc.) Preferably, embodiments of the present invention count M*N clocks of the oscillator frequency $f_{out}$ and then look for the phase of the baud rate clock of the received data on communication signal 110. If the frequency of the oscillators in the master 60 and the slave 62 devices match, there will be no phase error due to the aforementioned phase locked loop. However, if there is a frequency difference, a phase error will result and this error signal 150 (generated by phase error detector 178 which determines the correlation between the baud rate clock 172 and the received clock extracted from the communication signal 110) can be used as an indication of the direction and magnitude of the error in the frequency of oscillator 102. Typically, the oscillator frequency will be sufficiently precise that only a phase error will result. In devices where a phase error signal is not sufficient, i.e., when there is an error of multiple baud times, a unique portion of the received data, e.g., a synchronization pattern, may be used as a time reference for generating the error signal.

Figure 6:
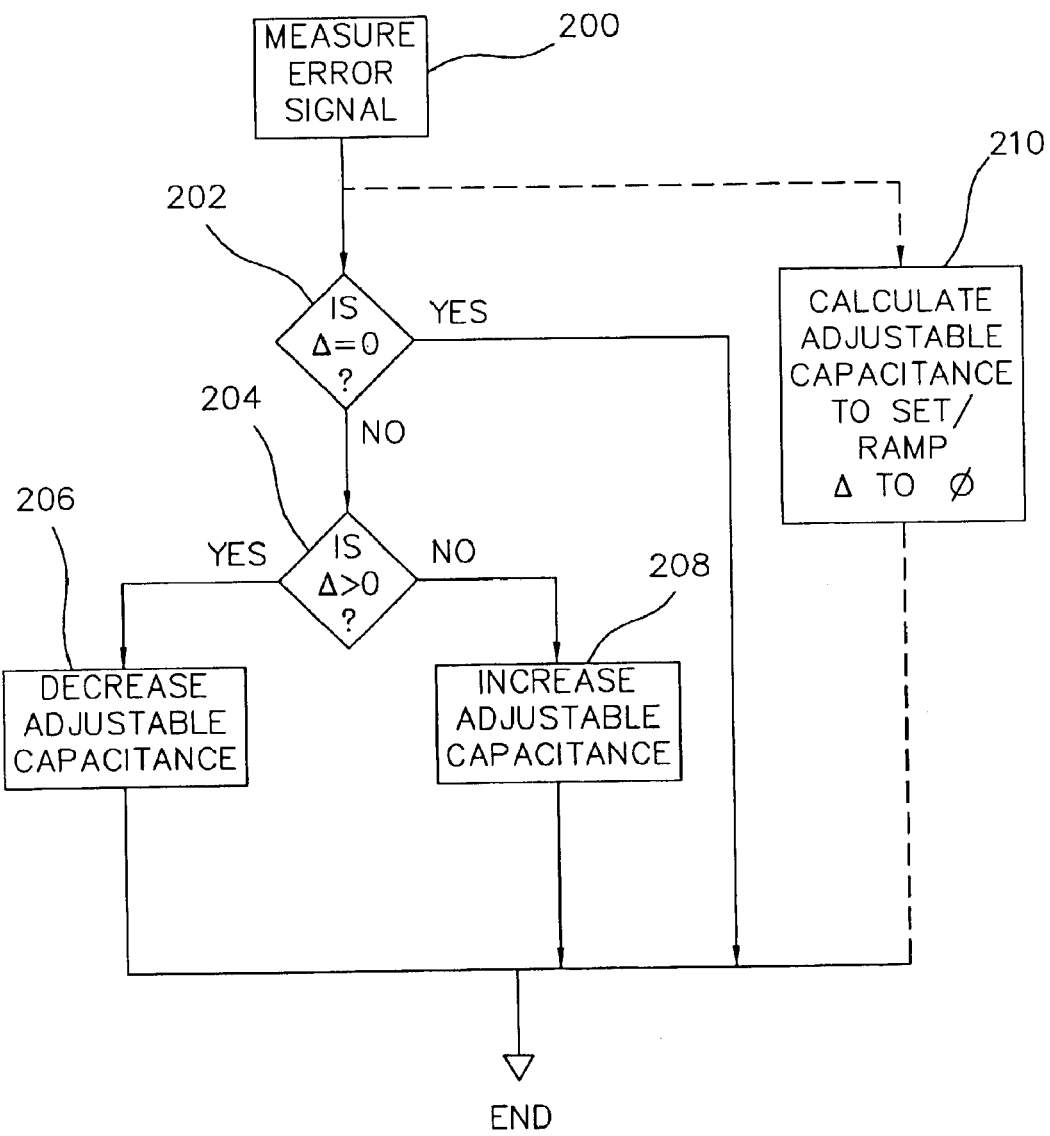
FIG. 6 shows a simplified flow chart of a closed loop control algorithm for adjusting the frequency of the crystal oscillator in response to an error signal derived from a timing measurement relative to the exemplary communication protocol.

If the error signal 150 is positive, then the clock rate of the oscillator 102 is too slow and should be increased. This clock rate increase is accomplished by reducing the programmable capacitance 118. Alternatively, if the error signal is negative, the oscillator 102 is too fast and the clock rate should be decreased, i.e., by increasing the programmable capacitance 118. FIG. 6 shows a simplified block diagram of such a closed loop control system. In block 200, the error signal 150 is measured. If the error signal 150 is zero (or within a designated range of zero) (see block 202), no adjustment is needed. However, if the error signal 150 is greater than zero (see block 204) (signifying that the oscillator is running too slow), the programmable capacitance 118 is decreased in block 206 to increase oscillator frequency. Alternatively, if the error signal 150 is less than zero (see block 204) (signifying that the oscillator is running too fast), the programmable capacitance 118 is increased in block 208 to decrease the oscillator frequency. Preferably, any adjustment is done according to the smallest possible step, e.g., a fine step of switch 126, so that the oscillator frequency adjusts smoothly toward the desired frequency without overshoot. However, if desired, the needed capacitance change may be calculated according to the measured error signal 150 to achieve the desired oscillator frequency in fewer iterations, i.e., faster (see the alternative path of block 210).

While the invention herein disclosed has been described by means of specific embodiments and applications thereof, numerous modifications and variations could be made thereto by those skilled in the art without departing from the scope of the invention set forth in the claims. For example, while a Vittoz-type oscillator is the preferred oscillator type, the present invention can beneficially improve the performance, i.e., decrease power consumption and decrease noise generation, of other oscillator structures as well. Furthermore, while a single adjustable capacitance has been shown coupled to either one of the connection nodes of the crystal, it is recognized that two adjustable capacitors may also be used where a first adjustable capacitance 118 is connected to the first node 120 and a second adjustable capacitor 118b (not shown but constructed in a similar manner to programmable capacitance 118) is connected to the second node 122. It is therefore to be understood that within the scope of the claims, the invention may be practiced otherwise than as specifically described herein.

What is claimed is:

1. A crystal oscillator system configured for alternatively minimizing power consumption or noise generation, said system comprising:
    a crystal oscillator;
    a first power supply for powering said crystal oscillator in a first mode of operation, wherein said first power supply operates as a switching downconverter to minimize power consumption;
    a second power supply for powering said crystal oscillator in a second mode of operation, wherein said second power supply operates as a series downconverter to minimize noise generation; and
    mode switching circuitry for alternatively powering said crystal oscillator from said first or said second power supply according to desired system parameters.

2. The crystal oscillator system of claim 1 configured for use in a communication system operating according to a communication protocol wherein said communication protocol is configured to have a majority of its time dedicated to intermessage delay portions between transmit and/or receive message portions and whereby said mode switching circuitry selects said second mode of operation during said transmit and/or receive message portions and said mode switching circuitry selects said first mode of operation during said intermessage delay portions.

3. The crystal oscillator system of claim 1 additionally comprising circuitry for adjusting the frequency of said crystal oscillator.

4. The crystal oscillator system of claim 3 whereby said crystal oscillator comprises a crystal having first and second interconnection nodes and wherein said frequency adjusting circuitry comprises a programmable capacitance to be added to a selected one of said interconnection nodes of said crystal whereby the frequency of said crystal oscillator is adjusted.

5. The crystal oscillator system of claim 4 wherein said programmable capacitance comprises a plurality of capacitors that are programmably coupled to said selected one of said interconnection nodes.

6. The crystal oscillator of claim 4 wherein said programmable capacitance comprises a coarse adjustable capacitance for setting an adjustment range and a fine adjustable capacitance for adjusting the capacitance relative to said adjustment range.

7. The crystal oscillator of claim 6 additionally comprising a thermometer decoder for forming said coarse adjustable capacitance.

8. The crystal oscillator of claim 4 additionally comprising measurement circuitry for measuring a frequency error signal wherein said programmable capacitance is adjusted in response to said error signal to cause said frequency error signal to decrease.

9. The crystal oscillator of claim 8 wherein said measurement circuitry periodically measures said frequency error signal.

10. The crystal oscillator of claim 9 wherein said programmable capacitance is adjusted to minimize said frequency error signal over a series of measurements.

11. The crystal oscillator of claim 8 wherein said measurement circuitry periodically measures said frequency error signal by determining a baud timing error relative to an external reference.

12. The crystal oscillator of claim 8 wherein said measurement circuitry periodically measures said frequency error signal by determining a baud timing error relative to a fixed reference in a communication protocol controlled by an external source.

13. The crystal oscillator of claim 8 wherein said measurement circuitry periodically measures said frequency error signal by determining a baud timing phase error relative to a fixed reference in a communication protocol controlled by an external source.

14. The crystal oscillator system of claim 3 wherein said crystal oscillator includes a crystal having a series resonant frequency below a target frequency and said crystal oscillator is configured to operate in a parallel resonant mode at a frequency above said series resonant frequency and said circuitry for adjusting the frequency of said crystal oscillator causes the frequency of said oscillator to be programmably adjusted toward the target frequency.

15. The crystal oscillator system of claim 1 wherein said first power supply operates as a constant current source.

16. The crystal oscillator system of claim 1 wherein said first power supply operates as a constant voltage source.

17. The crystal oscillator system of claim 1 wherein said second power supply comprises:
    a plurality of capacitors; and
    switching circuitry for alternatively coupling said capacitors in series to receive charge collectively at a first voltage or in parallel to provide charge collectively at a second voltage less than said first voltage.

18. The crystal oscillator system of claim 17 wherein said second voltage is essentially an integral fraction of said first voltage.

19. The crystal oscillator system of claim 18 wherein said second power supply includes three capacitors and said second voltage is essentially one third of said first voltage.

20. A method of alternatively minimizing power consumption or noise generation of a crystal oscillator, suitable for operation in a communication system operating according to a communication protocol wherein said communication protocol is configured to have a majority of its time dedicated to intermessage delay portions between transmit and/or receive message portions, said method comprising the steps of:
    powering said crystal oscillator via a series downconverter power supply during said transmit and/or receive message portions; and
    powering said crystal oscillator via a switching power supply during said intermessage delay portions.

21. The method of claim 20 wherein said powering said crystal oscillator via a series downconverter power supply step comprises maintaining a constant current output.

22. The method of claim 20 wherein said powering said crystal oscillator via a series downconverter power supply step comprises maintaining a constant voltage output.

23. The method of claim 20 wherein said powering said crystal oscillator via a switching power supply step comprises the steps of:
    periodically charging a plurality of capacitors coupled in series from a voltage source at a first voltage level; and
    periodically coupling said charged capacitors in parallel for providing power at a second voltage level, said second voltage level being essentially an integral fraction of said first voltage level.

24. A power supply configurable to alternatively operate in at least two modes of operation wherein in a first mode of operation, power consumption is minimized; and in a second mode of operation, noise generation is minimized, said power supply comprising:
- a switching downconverter for operating in said first mode of operation; and
- a series downconverter for operating in said second mode of operation.

25. The power supply of claim 24 wherein said power supply is used to power at least a portion of a communication system.

26. The power supply of claim 25 wherein said portion of said communication system comprises at least a crystal oscillator.

27. The power supply of claim 25 wherein said portion of said communication system comprises a crystal oscillator.

28. The power supply of claim 25 wherein said communication system operates according to a communication protocol wherein said communication protocol is configured to have a majority of its time dedicated to intermessage delay portions between transmit and/or receive message portions and whereby said series downconverter is activated during said transmit and/or receive message portions and said switching downconverter is activated during said intermessage delay portions.

29. The power supply of claim 24 wherein said series downconverter operates as a constant current source.

30. The power supply of claim 24 wherein said series downconverter operates as a constant voltage source.

31. The power supply of claim 24 wherein said switching downconverter comprises:
- a plurality of capacitors; and
- switching circuitry tar periodically, alternatively coupling said capacitors in series to receive charge collectively at a first voltage or in parallel to provide charge collectively at a second voltage less than said first voltage.

32. The power supply of claim 31 wherein said second voltage is essentially an integral fraction of said first voltage.

33. The power supply of claim 32 wherein said second power supply includes three capacitors and said second voltage is essentially one third of said first voltage.

34. A crystal oscillator having an adjustable frequency output, said crystal oscillator comprising:
- a crystal having first and second interconnection nodes;
- a programmable capacitance comprised of a plurality of capacitors that are programmably coupled to a selected one of said interconnection nodes of said crystal, whereby the frequency of said crystal oscillator is adjusted; and wherein
- said crystal oscillator includes a crystal having a series resonant frequency below a target frequency and said crystal oscillator is configured to operate in a parallel resonant mode at a frequency above said series resonant frequency and said circuitry for adjusting the frequency of said crystal oscillator causes the frequency of said oscillator to be programmably adjusted toward the target frequency.

35. The crystal oscillator of claim 34 wherein said programmable capacitance comprises a coarse adjustable capacitance for setting an adjustment range and a fine adjustable capacitance for adjusting the capacitance relative to said adjustment range.

36. The crystal oscillator of claim 35 additionally comprising a thermometer decoder for forming said coarse adjustable capacitance.

37. A crystal oscillator having an adjustable frequency output, said crystal oscillator comprising:
- a crystal having first and second interconnection nodes;
- a programmable capacitance for coupling to a selected one of said interconnection nodes of said crystal, whereby the frequency of said crystal oscillator is adjusted;
- measurement circuitry for periodically measuring a frequency error signal wherein said programmable capacitance is adjusted in response to said error signal to cause said frequency error signal to decrease; and wherein
- said programmable capacitance is adjusted to minimize said frequency error signal over a series of measurements and said measurement circuitry periodically measures said frequency error signal by determining a baud timing error relative to an external reference.

38. A crystal oscillator having an adjustable frequency output, said crystal oscillator comprising:
- a crystal having first and second interconnection nodes;
- a programmable capacitance for coupling to a selected one of said interconnection nodes of said crystal, whereby the frequency of said crystal oscillator is adjusted;
- measurement circuitry for periodically measuring a frequency error signal wherein said programmable capacitance is adjusted in response to said error signal to cause said frequency error signal to decrease; and wherein
- said programmable capacitance is adjusted to minimize said frequency error signal over a series of measurements and said measurement circuitry periodically measures said frequency error signal by determining a baud timing error relative to a fixed reference in a communication protocol controlled by an external source.

39. A crystal oscillator having an adjustable frequency output, said crystal oscillator comprising:
- a crystal having first and second interconnection nodes;
- a programmable capacitance for coupling to a selected one of said interconnection nodes of said crystal, whereby the frequency of said crystal oscillator is adjusted;
- measurement circuitry for periodically measuring a frequency error signal wherein said programmable capacitance is adjusted in response to said error signal to cause said frequency error signal to decrease; and wherein
- said programmable capacitance is adjusted to minimize said frequency error signal over a series of measurements and said measurement circuitry periodically measures said frequency error signal by determining a baud timing phase error relative to a fixed reference in a communication protocol controlled by an external source.

* * * * *

UNITED STATES PATENT AND TRADEMARK OFFICE
CERTIFICATE OF CORRECTION

PATENT NO. : 6,959,217 B2
DATED : October 25, 2005
INVENTOR(S) : DelMain et al.

It is certified that error appears in the above-identified patent and that said Letters Patent is hereby corrected as shown below:

Column 2,
Line 2, "It" should read -- it --.

Column 11,
Line 32, "tar" should read -- for --.

Signed and Sealed this

Twenty-first Day of February, 2006

JON W. DUDAS
*Director of the United States Patent and Trademark Office*